(12) United States Patent
Isono (10) Patent No.: US 7,781,335 B2
(45) Date of Patent: Aug. 24, 2010

(54) METHOD FOR FABRICATING SEMICONDUCTOR DEVICE

(75) Inventor: Shunsuke Isono, Toyama (JP)

(73) Assignee: Panasonic Corporation, Osaka (JP)

( * ) Notice: Subject to any disclaimer, the term of this patent is extended or adjusted under 35 U.S.C. 154(b) by 19 days.

(21) Appl. No.: 12/210,454

(22) Filed: Sep. 15, 2008

(65) Prior Publication Data
US 2009/0081865 A1 Mar. 26, 2009

(30) Foreign Application Priority Data
Sep. 20, 2007 (JP) ............................. 2007-243326

(51) Int. Cl.
*H01L 21/4763* (2006.01)
(52) U.S. Cl. ................. 438/643; 257/E21.584
(58) Field of Classification Search ................. 438/597, 438/627, 629, 624, 643; 257/E21.584, E23, 257/E21
See application file for complete search history.

(56) References Cited

U.S. PATENT DOCUMENTS

| 5,985,747 A | 11/1999 | Taguchi |
| 6,187,632 B1 | 2/2001 | Shuto et al. |
| 6,458,703 B2 | 10/2002 | Endo et al. |
| 6,849,549 B1 * | 2/2005 | Chiou et al. ................. 438/692 |
| 2003/0087513 A1 * | 5/2003 | Noguchi et al. ............. 438/627 |
| 2006/0276029 A1 * | 12/2006 | Usami et al. ................. 438/629 |

FOREIGN PATENT DOCUMENTS

JP 2003-031652 1/2003

OTHER PUBLICATIONS

N. Matsunaga et al., "BEOL Process Integration Technology for 45nm Node Porous Low- k/Copper Interconnects," International Interconnect Technology Conference, Jun. 6-8, 2005.

* cited by examiner

*Primary Examiner*—Matthew Smith
*Assistant Examiner*—Wilner Jean Baptiste
(74) *Attorney, Agent, or Firm*—McDermott Will & Emery LLP (57) ABSTRACT

A method for fabricating a semiconductor device includes the steps of: (a) forming a first insulating film having moisture absorbency on a substrate; (b) forming a dummy contact hole and a contact hole in the first insulating film; (c) heat-treating the substrate, thereby removing water contained in the first insulating film; and (d) forming a contact and a dummy contact. The heat treatment in the step (c) removes water contained in the first insulating film through the contact hole and the dummy contact hole.

32 Claims, 6 Drawing Sheets

Element
Melting point  M $$Me + O_2 = MeO_2 \quad (1)$$
$$\Delta G^\circ = RT \ln P_{O_2} \quad (2)$$

METHOD FOR FABRICATING SEMICONDUCTOR DEVICE

BACKGROUND OF THE INVENTION

1. Field of the Invention

The present invention relates to a method for fabricating a semiconductor device, and more particularly relates to a technique for forming interconnects in a multilevel interconnection in which insulating films are formed between interconnect layers.

2. Description of the Related Art

In recent years, miniaturization of semiconductor integrated circuits has been significantly advanced, and the degree of integration has been tremendously increasing. As the number of devices integrated on a single semiconductor integrated circuit has been increasing, delay time is expected to be reduced. However, in practice, although transistor delay time can be reduced, wiring resistance and parasitic capacitance are increased, making it difficult to reduce wiring delay time. In order to lower wiring resistance, instead of conventionally used aluminum, copper having a lower resistance is used as a wiring material. Also, in order to reduce parasitic capacitance, insulating films having low dielectric constants are used as insulating films. Due to difficulties in patterning copper by etching, copper interconnects are typically formed by a Damascene process, in which after formation of a trench pattern, trenches are filled with copper, and then the upper surface of the copper film is planarized by a chemical mechanical polishing process to form interconnects.

Figure 1:
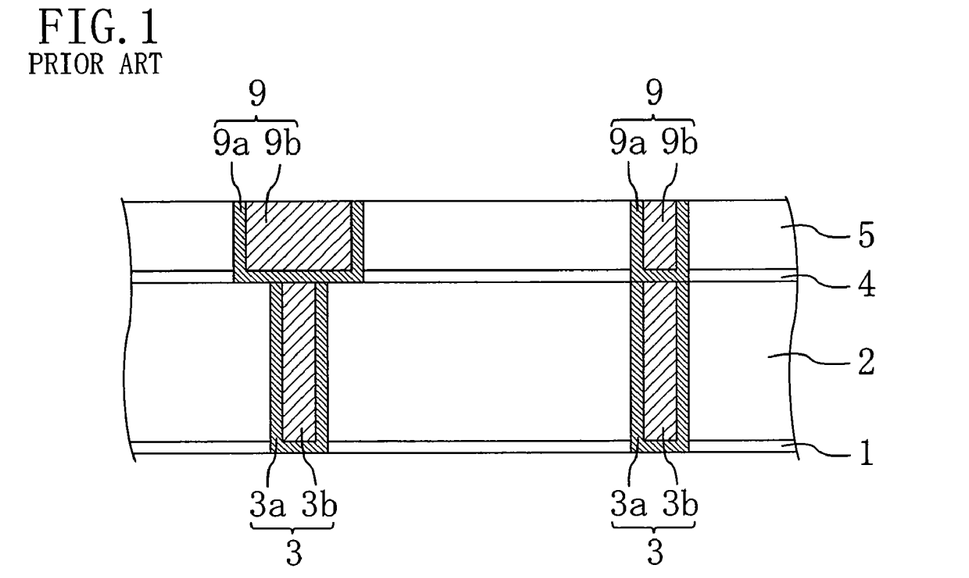
FIG. 1 is a cross-sectional view of a conventional semiconductor device.

FIG. 1 is a cross-sectional view of a conventional semiconductor device. As shown in FIG. 1, in the conventional semiconductor device, a second insulating film 2 which is relatively high in moisture absorbency is formed on a first insulating film 1 formed on a silicon substrate. In the second insulating film 2, contacts 3, each composed of a barrier metal film 3a made of titanium/titanium nitride or tantalum nitride/tantalum and a metal film 3b made of copper or tungsten, are formed through the second insulating film 2. A third insulating film 4 made of a silicon carbon nitride film is formed on the second insulating film 2. A fourth insulating film 5 is formed on the third insulating film 4. In the third and fourth insulating films 4 and 5, metal interconnects 9, each composed of a barrier metal film 9a made of tantalum nitride/tantalum and a metal film 9b made of copper or the like, are formed.

FIGS. 2A through 2D are cross-sectional views illustrating process steps for fabricating the conventional semiconductor device. A method for fabricating the conventional semiconductor device will be described in detail below.

Figure 2A:
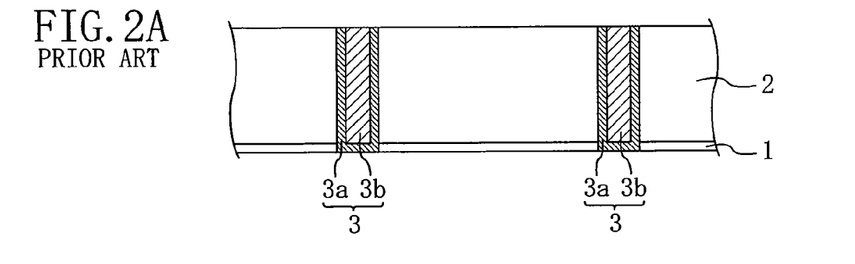
FIGS. 2A through 2D are cross-sectional views illustrating process steps for fabricating the conventional semiconductor device.

First, as shown in FIG. 2A, contacts 3, each composed of a barrier metal film 3a and a metal film 3b made of copper or tungsten, are formed. To be specific, a first insulating film 1 is formed on a silicon substrate. Then, a second insulating film 2 having relatively high moisture absorbency is formed on the first insulating film 1. Next, a contact hole pattern made of a photoresist is formed on the second insulating film 2 by a photolithography process, and contact holes are formed by a dry etching process using the contact hole pattern. Subsequently, a barrier metal film 3a made of tantalum nitride/tantalum or titanium/titanium nitride is deposited on the bottoms and sidewalls of the contact holes so as to reach the upper surface of the second insulating film 2. Then, a metal film 3b made of copper or tungsten is deposited on the barrier metal film 3a so as to fill the contact holes. Next, part of the barrier metal film 3a and part of the metal film 3b formed outside the contact holes are removed by a chemical mechanical polishing process. As a result, the contacts 3 composed of the barrier metal film 3a and the metal film 3b made of copper or tungsten are formed.

Figure 2B:
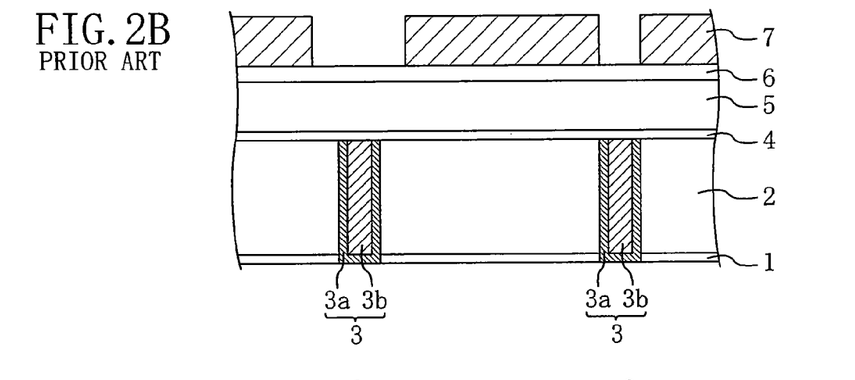

Subsequently, as shown in FIG. 2B, a wiring groove pattern 7 is formed above the silicon substrate. Specifically, a third insulating film 4 made of a silicon carbon nitride film is deposited on the second insulating film 2 and on the contacts 3. Thereafter, a fourth insulating film 5 made of a carbon-containing silicon oxide film is deposited on the third insulating film 4. Then, an antireflection film 6 is deposited on the fourth insulating film 5. Next, the wiring groove pattern 7 made of a photoresist is formed on the antireflection film 6 by a photolithography process.

Figure 2C:
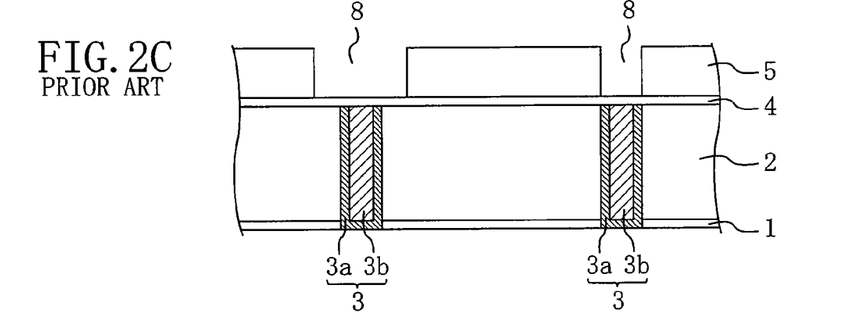

Next, as shown in FIG. 2C, wiring grooves 8 are formed in the fourth insulating film 5. To be specific, parts of the antireflection film 6 and parts of the fourth insulating film 5 are removed by dry etching in accordance with the wiring groove pattern 7, thereby forming the wiring grooves 8. Subsequently, the wiring groove pattern 7 and the antireflection film 6 are removed by ashing.

Figure 2D:
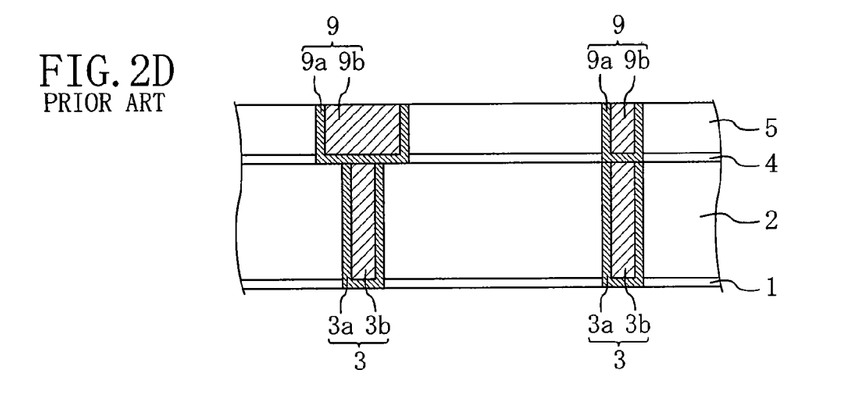

Then, as shown in FIG. 2D, metal interconnects 9 connected with the contacts 3 are formed. To be specific, parts of the third insulating film 4 defining the bottoms of the wiring grooves 8 are removed by etching, thereby exposing the contacts 3. Subsequently, a barrier metal film 9a made of tantalum nitride/tantalum is deposited on the bottoms and sidewalls of the wiring grooves 8 and on the fourth insulating film 5. Next, a metal film 9b made of copper or the like is deposited on the barrier metal film 9a so as to fill the wiring grooves 8. Then, part of the barrier metal film 9a and part of the metal film 9b formed outside the wiring grooves 8 are removed by a chemical mechanical polishing process. As a result, the metal interconnects 9 including the barrier metal film 9a and the metal film 9b are formed.

SUMMARY OF THE INVENTION

However, in the semiconductor device fabricated by the conventional fabrication method, a water degassing phenomenon sometimes occurs in which water escapes from the second insulating film 2 that has relatively high moisture absorbency. If water in the second insulating film 2 escapes, the heat resistance and insulating property of the insulating films are degraded. Furthermore, the water degassing phenomenon sometimes causes a reduction in the adhesion of the interface between the second insulating film 2 having relatively high moisture absorbency and the third insulating film 4 whose moisture absorbency is lower than that of the second insulating film 2, allowing atoms present in the vicinity of the interface to move easily, resulting in short circuits between the contacts and between the interconnects. In addition, the water degassing from the second insulating film 2 causes oxidation of the barrier metal films 3a of the contacts 3 and oxidation of the barrier metal films 9a of the metal interconnects 9, resulting in poor adhesion to the insulating films and to the metals and thus leading to the occurrence of open-circuit faults.

It is therefore an object of the invention to provide a method for fabricating a semiconductor device which includes insulating films and metal interconnects and in which defects in the insulting films, such as degradation of the heat resistance and insulating property thereof, are suppressed.

In order to achieve the object, a first inventive method for fabricating a semiconductor device includes the steps of: (a) forming a first insulating film having moisture absorbency on a substrate; (b) forming a dummy contact hole and a contact hole in the first insulating film, the contact hole going fully through the first insulating film; (c) heat-treating the substrate, thereby removing water contained in the first insulating film; and (d) filling the contact hole and the dummy contact hole with a conductive material, thereby forming a contact and a dummy contact.

According to this method, since water is removed from the first insulating film having moisture absorbency in the step (c), it is possible to prevent water from escaping from the first insulating film after the completion of the fabrication process steps. Thus, degradation of the heat resistance and insulating property of the first insulating film is suppressed, and deterioration of the adhesion between the first insulating film and an insulating film formed thereon or the like is prevented. In addition, in the first fabrication method, the formation of the dummy contact enables the water to be removed more effectively in the step (c).

In a case in which a barrier metal film is used for the contact and the dummy contact, if this barrier metal film is made of an oxidizing metal, the barrier metal film is oxidized by the water removed from the first insulating film during the heat treatment, thereby suppressing failures that would otherwise be caused by the removed water.

A second inventive method for fabricating a semiconductor device includes the steps of: (a) forming, on a substrate, a first insulating film in which a contact hole is formed and which has moisture absorbency; (b) filling the contact hole with a conductive material, thereby forming a contact going fully through the first insulating film; (c) forming, on the first insulating film, a second insulating film, in which a wiring groove is formed on the contact and a dummy wiring groove is formed on the first insulating film; (d) after the step (c), heat-treating the substrate, thereby removing water contained in the first insulating film; and (e) filling the wiring groove and the dummy wiring groove with a conductive material, thereby forming an interconnect and a dummy interconnect.

According to this method, since water is removed from the first insulating film having moisture absorbency in the step (d), it is possible to prevent water from escaping from the first insulating film after the completion of the fabrication process steps.

Moreover, by performing the heat treatment after the formation of the dummy wiring groove, water is removed more effectively as compared to cases in which no dummy wiring groove is formed.

DETAILED DESCRIPTION OF THE INVENTION

First Embodiment

A method for fabricating a semiconductor device according to a first embodiment of the invention will be described with reference to FIGS. 3A to 3D.

Figure 3A:
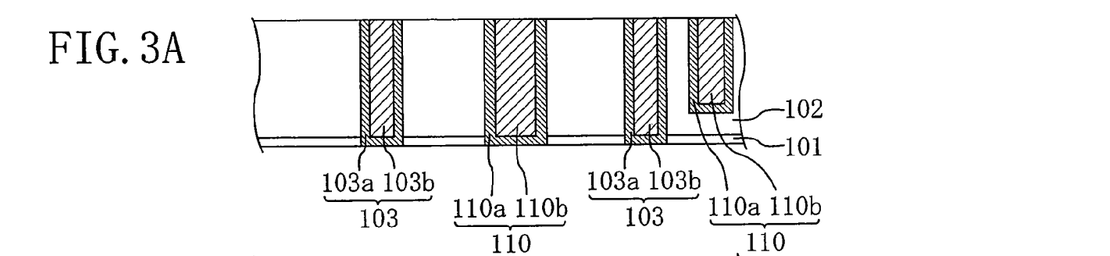
FIGS. 3A to 3D are cross-sectional views illustrating process steps in a method for fabricating a semiconductor device according to a first embodiment of the invention.

First, as shown in FIG. 3A, contacts 103, each composed of a barrier metal film 103a and a metal film 103b, and dummy contacts 110, each composed of a barrier metal film 110a and a metal film 110b, are formed on a silicon substrate (not shown). To be specific, a first insulating film 101 is formed on the silicon substrate by a known method such as a CVD process. Then, a second insulating film 102, which is relatively high in moisture absorbency, is formed on the first insulating film 101. Next, a contact hole pattern made of a photoresist is formed on the second insulating film 102 by a photolithography process, and contact holes and dummy contact holes are formed by a dry etching process using this contact hole pattern. These dummy contact holes may or may not go through the second insulating film 102. Then, a heat treatment is performed at a temperature of 200° C. to 800° C. so as to remove (degas) water from the second insulating film 102 that has relatively high moisture absorbency. The reason why the heat treatment is performed at a temperature of 200° C. to 800° C. will be described below.

Figure 4:
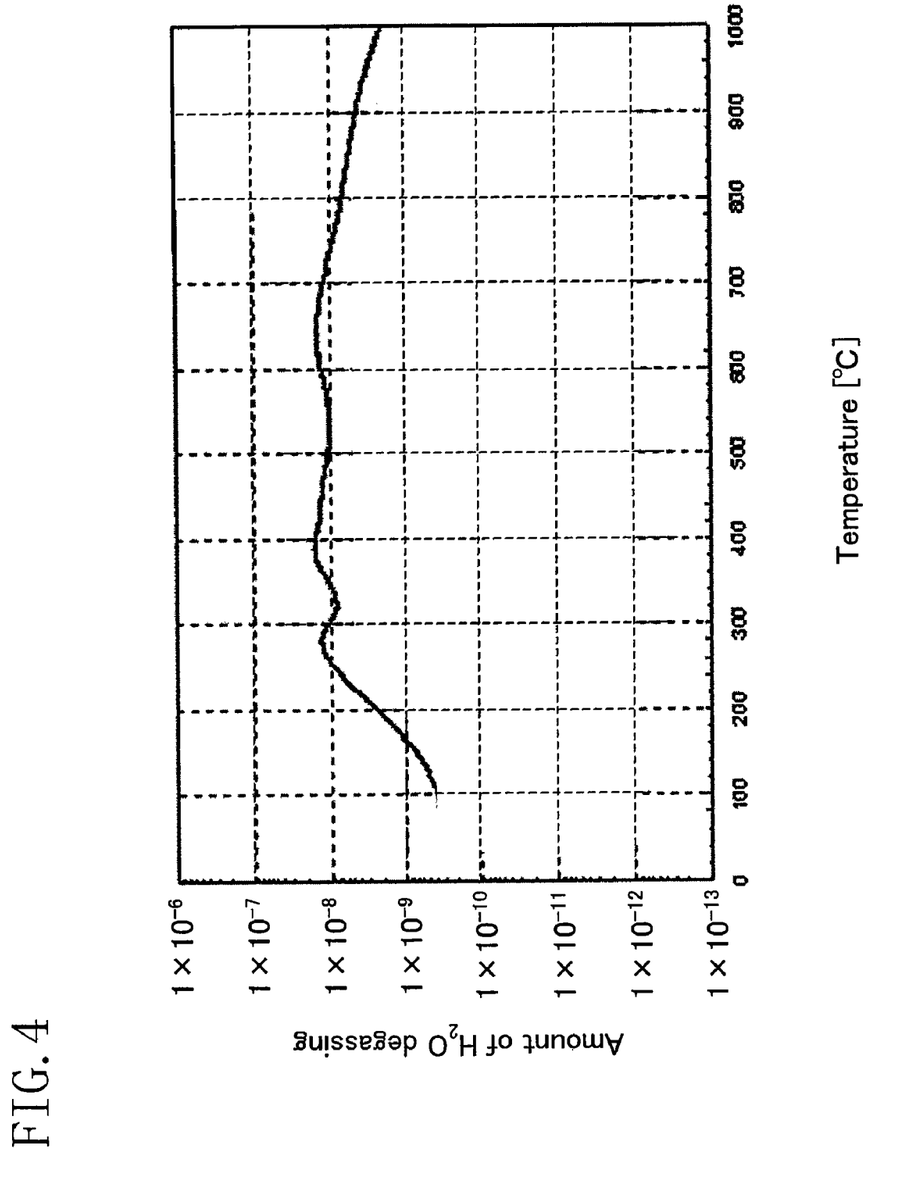
FIG. 4 shows the amount of $H_2O$ degassing from an insulating film having relatively high moisture absorbency, obtained when temperature was varied.

FIG. 4 shows the temperature dependence of the amount of water removed from a silicon oxide film having relatively high moisture absorbency when the silicon oxide film was heat-treated in a hydrogen atmosphere. The abscissa indicates the temperature, and the ordinate indicates the amount of removed water.

As can be seen from FIG. 4, the amount of removed water is increased when the temperature is 200° C. or higher. Thus, to sufficiently remove water, it is necessary to perform the heat treatment at 200° C. or higher. Furthermore, from a practical point of view, the upper limit temperature for the heat treatment of the second insulating film 102 having relatively high moisture absorbency is preferably 800° C. or lower. Also, in this process step, the heat treatment is performed in a hydrogen atmosphere, but may be performed in a nitrogen atmosphere, in an oxygen atmosphere, or in a rare gas atmosphere. In this manner, a feature of the fabrication method of this embodiment is that the water contained in the second insulating film 102 is removed by the heat treatment.

Subsequently, a multilayer film made of tantalum nitride/tantalum or titanium/titanium nitride is deposited on the bottoms and sidewalls of the contact holes, on the bottoms and sidewalls of the dummy contact holes, and on the upper surface of the second insulating film 102. Then, a metal film made of copper or tungsten is deposited on the multilayer film so as to fill the contact holes and the dummy contact holes. Next, part of the multilayer film and part of the metal film formed outside the contact holes and the dummy contact holes are removed by a chemical mechanical polishing process. As a result, the contacts 103 each composed of the barrier metal film 103a and the metal film 103b and the dummy contacts 110 each composed of the barrier metal film 110a and the metal film 110b are formed. The "dummy contacts" herein mean dummy contacts which are not actually used as circuits. The second insulating film 102 formed in this process step is made of, e.g., a silicon oxide film which has relatively high moisture absorbency, while the first insulating film 101 is made of a silicon nitride film or the like whose moisture absorbency is lower than that of the second insulating film 102. It should be noted that the moisture absorbency of a silicon oxide film varies depending on how the film is grown. An oxide film having high moisture absorbency can be grown under conditions in which the pressure is 10 Torr ($1.33 \times 10^4$ Pa) or higher and the temperature is 400° C. or lower, for example, but is not limited to these conditions. It does not particularly matter what method is employed so long as the resultant film has relatively high moisture absorbency.

Figure 3B:
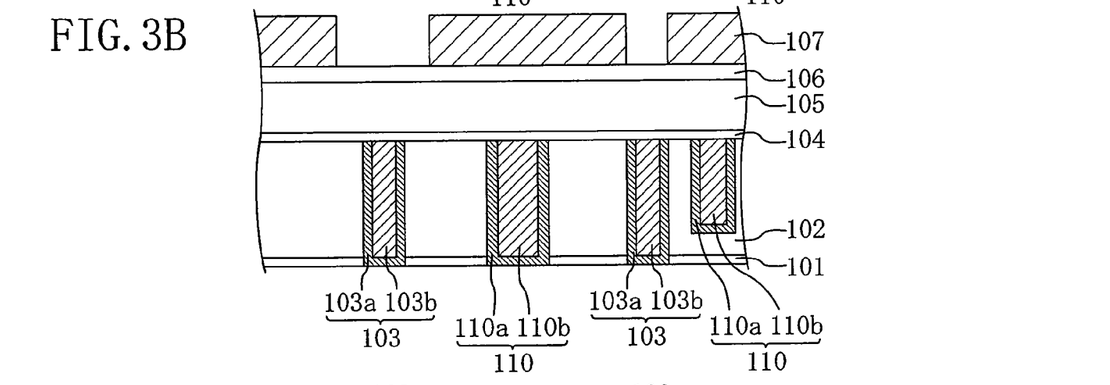

Next, as shown in FIG. 3B, a wiring groove pattern 107 is formed above the contacts 103. Specifically, a third insulating film 104 made of a silicon carbon nitride film, for suppressing diffusion of a wiring material (such as copper), is deposited on the second insulating film 102 and on the contacts 103 by a CVD process or the like. Then, on the third insulating film 104, a fourth insulating film 105 made of a carbon-containing silicon oxide film is deposited by a CVD process or the like. Thereafter, an antireflection film 106 is deposited on the fourth insulating film 105 by a CVD process or the like. Next, the wiring groove pattern 107 made of a photoresist is formed on the antireflection film 106 by a photolithography process. The third insulating film 104 and the fourth insulating film 105 have lower moisture absorbency than the second insulating film 102.

Figure 3C:
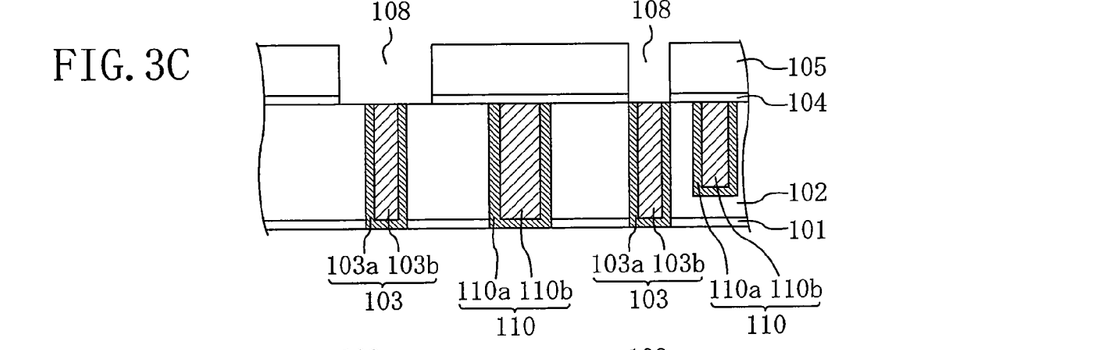

Subsequently, as shown in FIG. 3C, wiring grooves 108 are formed above the contacts 103. To be specific, parts of the antireflection film 106 and parts of the fourth insulating film 105 are removed by dry etching in accordance with the wiring groove pattern 107, thereby forming the wiring grooves 108. Then, the wiring groove pattern 107 and the antireflection film 106 are removed by ashing.

Figure 3D:
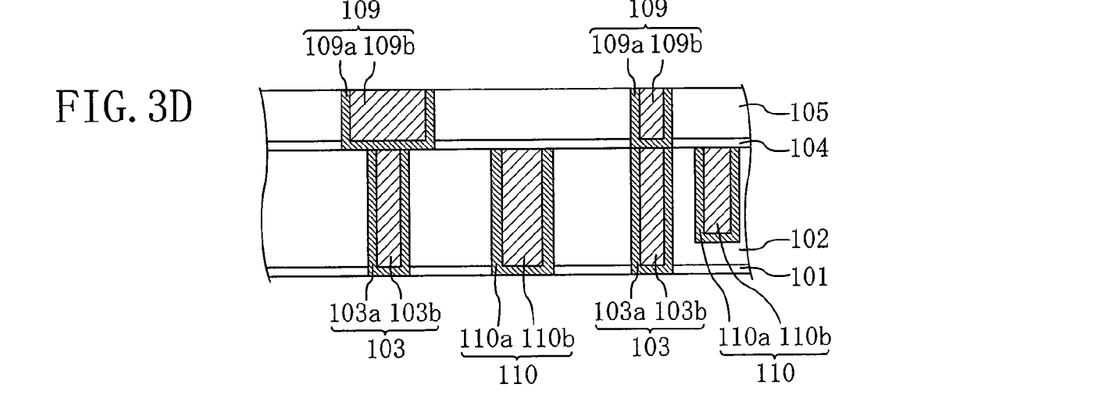

Thereafter, as shown in FIG. 3D, metal interconnects 109 are formed. Specifically, parts of the third insulating film 104 made of a silicon carbon nitride film, defining the bottoms of the wiring grooves 108, are removed by etching, thereby exposing the upper surfaces of the contacts 103 and part of the upper surface of the second insulating films 102. Then, a barrier metal film made of tantalum nitride/tantalum is deposited on the bottoms and sidewalls of the wiring grooves 108 (on the second insulating film 102) and on the upper surface of the fourth insulating film 105. Subsequently, a metal film made of copper or the like is deposited on the barrier metal film so as to fill the wiring grooves 108. Next, part of the barrier metal film and part of the metal film formed outside the wiring grooves 108 are removed by a chemical mechanical polishing process. As a result, the metal interconnects 109, each composed of the barrier metal film 109a and the metal film 109b, are formed.

In the fabrication method of the first embodiment of the invention, in the process step shown in FIG. 3A, after the formation of the contact holes and the dummy contact holes, the heat treatment is performed before the contacts 103 and the dummy contacts 110 are formed. By this heat treatment, water is effectively removed from the second insulating film 102 having relatively high moisture absorbency through the contact holes and the dummy contact holes. As a result, in the method of this embodiment, it is possible to suppress degradation of the heat resistance and insulating property of the second insulating film 102 and deterioration of the adhesion of the interface between the second and third insulating films 102 and 104. In addition, oxidation of the barrier metal films is suppressed, thereby preventing the reliability of the interconnects from decreasing. In the method of this embodiment, the formation of the dummy contact holes enables water contained in an inner part of the second insulating film 102 to be removed more effectively. Furthermore, the dummy contacts also produce the effect of suppressing the occurrence of dishing during polishing process.

Moreover, the relatively larger the diameter of the contact holes and the diameter of the dummy contact holes, the better. This is because the amount of water degassing can be increased by increasing the opening areas of the contact holes and of the dummy contact holes. Furthermore, the water degassing efficiency can be increased by making the diameter of the dummy contact holes be 0.5 to 10 times the minimum size of the diameter of the contact holes (which is determined by design rules). This range of the diameter sizes indicates sizes that allow the contact holes and the dummy contact holes to be formed properly. Moreover, it is more desirable that the diameter of the contact holes be 1 to 10 times the minimum size of the diameter of the contact holes, because the water degassing efficiency can be enhanced further.

Also, the relatively greater the number of the contact holes and the number of the dummy contact holes, the better. This is because the amount of water degassing can be increased by increasing the number of the contact holes and the number of the dummy contact holes.

Furthermore, the degassing efficiency can be increased by making the ratio of the sum total of the opening areas of all of the contact holes and the dummy contact holes to the total area (of the substrate) including the area other than the openings be 0.1% to 50%. This ratio is determined by the numbers that allow proper formation of the contact holes and the dummy contact holes and by the sizes of the openings.

Furthermore, the dummy contact holes do not have to be formed so as to reach the upper surface of the substrate. Even if the dummy contact holes are formed to reach only partway into the second insulating film 102 having relatively high moisture absorbency, degassing is effectively performed from the sidewalls and bottoms of the dummy contact holes.

Also, in the inventive method according to the first embodiment of the invention, in the process step shown in FIG. 3A, after the formation of the contact holes and the dummy contact holes, the heat treatment is performed before the formation of the contacts 103 and the dummy contacts 110. Instead of this process step or in addition to this process step, a heat treatment may be performed after the chemical mechanical polishing process performed to form the contacts 103 and the dummy contacts 110. This process step produces the following effects.

When the barrier metal film and the metal film on the second insulating film 102 are removed by the chemical mechanical polishing process, part of the second insulating film 102 that has relatively high moisture absorbency is also polished. Water contained in the second insulating film 102 is likely to be removed from the surface, while water contained in an inner part of the insulating film is not likely to be removed. Thus, before the upper surface of the second insulating film 102 is polished, water near the upper surface of the second insulating film 102 has been removed, but water in the inner part of the second insulating film 102 has not been sufficiently removed. In such a situation, if the upper surface of the second insulating film 102 is polished, the part of the insulating film located as the inner part before the polishing process is exposed after the polishing process. At this time, if the upper interconnects are formed on the upper surface of the post-polishing second insulating film 102 from which water has not been completely removed, it becomes impossible to remove the water from the contact portions in which the second insulating film 102 is in contact with the upper interconnects. In contrast, if a heat treatment is performed after the polishing process, the effect of the degassing on the upper interconnects is suppressed.

Also, in the method of this embodiment, in the process step of forming the cross section shown in FIG. 3A, the heat treatment is performed after the formation of the contact holes and the dummy contact holes. However, instead of this process step or in addition to this process step, a heat treatment may be performed after the contact holes and the dummy contact holes are filled with a barrier metal film made of an oxidizing metal such as molybdenum. This process step produces the following effects.

Figure 5:
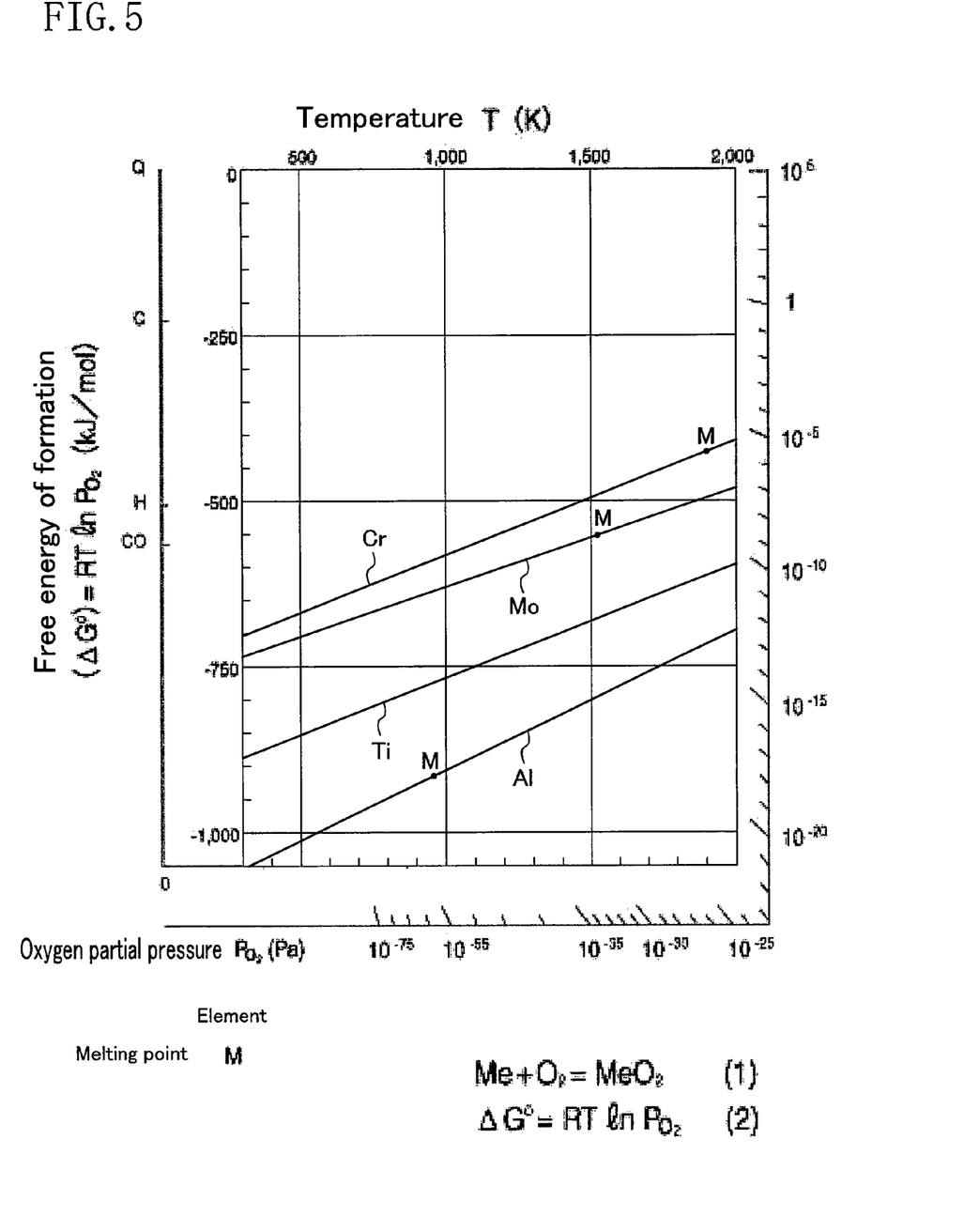
FIG. 5 shows energy of formation of various oxides.

FIG. 5 shows energy of formation of various oxides. The abscissa indicates the oxygen partial pressure, and the ordinate indicates the free energy of formation. As can be seen from FIG. 5, molybdenum whose oxide-formation energy is low easily reacts with water ($H_2O$) to form an oxide. Thus, if a heat treatment is performed after a barrier metal film made of an oxidizing metal, such as molybdenum, or made of a molybdenum nitride is formed in the contact holes and the dummy contact holes and on the upper surface of the second insulating film, water from the insulating film that has relatively high moisture absorbency preferentially reacts with the barrier metal film, thereby producing the effect of suppressing degradation of the other insulating films. It should be noted that since a molybdenum oxide is conductive, the conductivity of the contacts and of the interconnects is maintained even if the barrier metal film is oxidized. In the example described above, molybdenum and a molybdenum nitride are used as the barrier metal film, however, the same effects will be achieved even if chromium, cobalt, platinum, and tungsten, which are also oxidizing metals, and nitrides thereof are used as the barrier metal film.

In the case in which an oxidizing metal, such as molybdenum, is used as the barrier metal film, if a heat treatment is performed not only after the formation of the barrier metal film and before the formation of the metal film, but also after filling the wiring grooves with the metal film, the barrier metal film made of an oxidizing metal preferentially reacts with water, thereby further suppressing degradation of the insulating films. FIG. 5 is an excerpt from "Kinzoku Seiren" published by The Japan Institute of Metals in 1979.

Moreover, in the method of this embodiment, a silicon oxide film having relatively high moisture absorbency is used as the second insulating film 102, however, a material that has such an excellent filling characteristic as being able to fill a gap between narrow-pitch gates without causing voids, such as an $O_3$-TEOS (Tetraetylorthosilicate) film or an SOD (Spin on Dielectric) film, or a low dielectric-constant insulating film material, such as an OSG (organo-silicate glass) film, a methyl-silsesquioxane (MSQ) film, or a carbon-containing silicon oxide (SiOCH) film, may be used instead.

Furthermore, the shape of the openings of the dummy contact holes may be square, rectangular, or circular.

In the method described in this embodiment, the heat treatment for removing water is performed in forming the contacts and the metal interconnects in the different process steps. Nevertheless, the heat treatment for removing water contained in the second insulating film 102 is effective even in a so-called a Dual Damascene process, in which contact holes and wiring grooves are filled in the same process step to form contacts and metal interconnects at the same time.

Second Embodiment

A method for fabricating a semiconductor device according to a second embodiment of the invention will be described with reference to FIGS. 6A to 6D. FIGS. 6A through 6D are cross-sectional views illustrating process steps in the semiconductor device fabrication method of this embodiment.

Figure 6A:
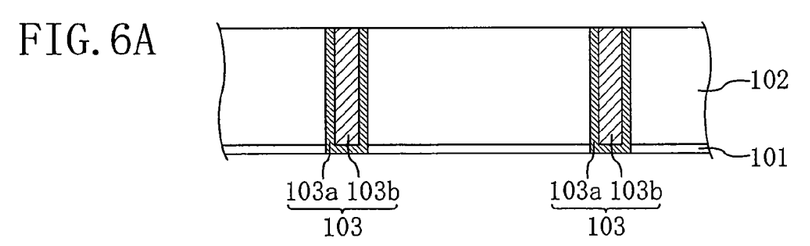
FIGS. 6A through 6D are cross-sectional views illustrating process steps in a method for fabricating a semiconductor device according to a second embodiment of the invention.

First, as shown in FIG. 6A, contacts 103, each composed of a barrier metal film 103a and a metal film 103b, are formed on a silicon substrate (not shown). To be specific, a first insulating film 101 is formed on the silicon substrate by a kwon method such as a CVD process. Then, a second insulating film 102 which is relatively high in moisture absorbency is formed on the first insulating film 101. Next, a contact hole pattern made of a photoresist is formed on the second insulating film 102 by a photolithography process, and contact holes are formed by a dry etching process using this contact hole pattern. Subsequently, a multilayer film made of tantalum nitride/tantalum or titanium/titanium nitride is deposited on the bottoms and sidewalls of the contact holes and on the upper surface of the second insulating film 102. Then, a metal film made of copper or tungsten is deposited on the multilayer film so as to fill the contact holes. Thereafter, part of the multilayer film and part of the metal film formed outside the contact holes are removed by a chemical mechanical polishing process. As a result, the contacts 103 composed of the barrier metal film 103a and the metal film 103b are formed.

Figure 6B:
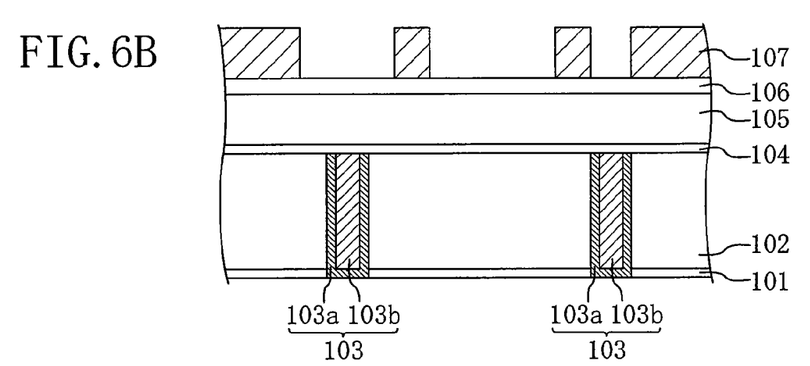

Next, as shown in FIG. 6B, a wiring groove pattern 107 is formed above the contacts 103. Specifically, a third insulating film 104 made of a silicon carbon nitride film, for suppressing diffusion of a wiring material (such as copper), is deposited on the second insulating film 102 and on the contacts 103 by a CVD process or the like. Then, a fourth insulating film 105 made of a carbon-containing silicon oxide film is deposited on the third insulating film 104 by a CVD process or the like. Thereafter, an antireflection film 106 is deposited on the fourth insulating film 105 by a CVD process or the like. Next, the wiring groove pattern 107 made of a photoresist is formed on the antireflection film 106 by photolithography.

Figure 6C:
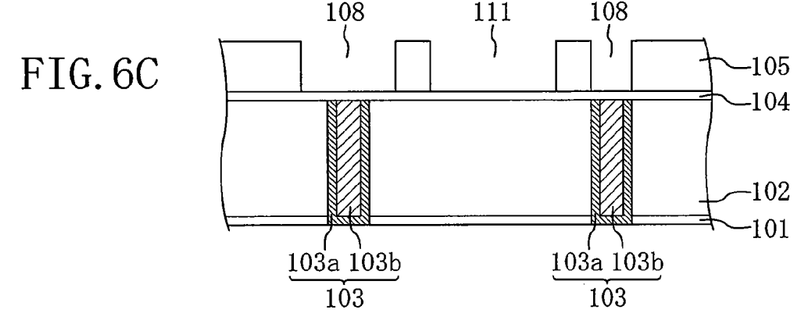

Subsequently, as shown in FIG. 6C, wiring grooves 108 and a dummy wiring groove 111 are formed above the contacts 103 and above the second insulating film 102. To be specific, parts of the antireflection film 106 and parts of the fourth insulating film 105 are removed by dry etching in accordance with the wiring groove pattern 107, thereby forming the wiring grooves 108 and the dummy wiring groove 111. Then, the wiring groove pattern 107 and the antireflection film 106 are removed by ashing. "Dummy interconnects" herein mean dummy interconnects which are not actually used as circuits, and the "dummy wiring groove" herein means a groove for forming a dummy interconnect.

Figure 6D:
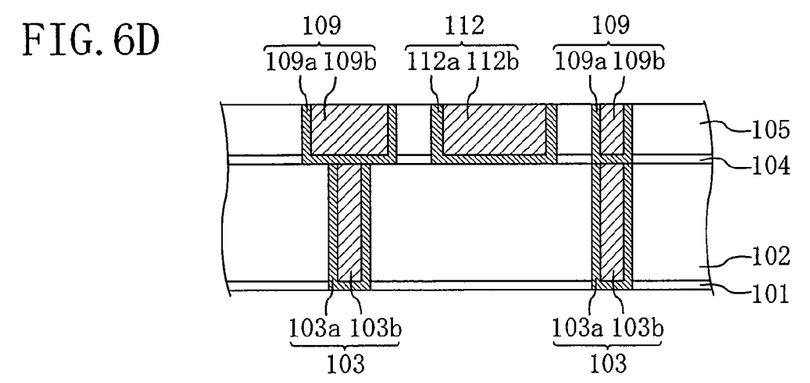

Thereafter, as shown in FIG. 6D, metal interconnects 109 are formed on the contacts 103, and a dummy interconnect 112 is formed on the second insulating film 102. Specifically, parts of the third insulating film 104 made of a silicon carbon nitride film, defining the bottoms of the wiring grooves 108 and of the dummy wiring groove 111, are first removed by etching, thereby exposing the upper surfaces of the contacts 103 and part of the upper surface of the second insulating film 102.

Then, a heat treatment is performed at a temperature of 200° C. to 800° C. to remove water from the second insulating film 102 having relatively high moisture absorbency. The reason why the heat treatment is performed at a temperature between 200° C. to 800° C. is as described in the first embodiment. That is, as can be seen from the experimental results shown in FIG. 4, the amount of water removed from the insulating film is increased at 200° C. or higher, and a temperature of 800° C. or lower is preferable in view of practical semiconductor processes.

In the method of this embodiment, the heat treatment is performed in a hydrogen atmosphere, but the heat treatment described above may be performed in a nitrogen atmosphere, in an oxygen atmosphere, or in a rare gas atmosphere.

Next, a barrier metal film made of tantalum nitride/tantalum is deposited on the bottoms and sidewalls of the wiring grooves 108 and of the dummy wiring groove 111 (on the second insulating film 102) and on the upper surface of the fourth insulating film 105. Subsequently, a metal film made of copper or the like is deposited on the barrier metal film so as to fill the wiring grooves 108 and the dummy wiring groove 111. Next, part of the barrier metal film and part of the metal film formed outside the wiring grooves 108 and the dummy wiring groove 111 are removed by a chemical mechanical polishing process. As a result, the metal interconnects 109 composed of the barrier metal film 109a and the metal film 109b, and the dummy interconnect 112 composed of the barrier metal film 112a and the metal film 112b are formed.

In the fabrication method of the second embodiment of the invention, in the process step shown in FIG. 6D, after the formation of the wiring grooves 108 and the dummy wiring groove 111, the heat treatment is performed before the metal interconnects 109 and the dummy interconnect 112 are formed. By this heat treatment, water is effectively removed from the second insulating film 102 having relatively high moisture absorbency through the wiring grooves 108 and the dummy wiring groove 111. As a result, in the method of this embodiment, it is possible to suppress degradation of the heat resistance and insulating property of the second insulating film 102 and deterioration of the adhesion of the interface between the second and third insulating films 102 and 104. In addition, oxidation of the barrier metal films is suppressed, thereby preventing the reliability of the interconnects from decreasing.

Moreover, the relatively larger the width of the wiring grooves 108 and the width of the dummy wiring groove 111, the better. This is because the amount of water degassing can be increased by increasing the opening areas of the wiring grooves 108 and of the dummy wiring groove 111. Furthermore, the water degassing efficiency can be increased by making the width of the dummy wiring groove be 0.5 to 100 times the minimum size of the width of the wiring grooves with respect to the minimum size of the width of the wiring grooves. This range of the width sizes indicates sizes that allow the wiring grooves 108 and the dummy wiring groove 111 to be formed properly. Moreover, it is more desirable that the width of the wiring grooves 108 be 1 to 100 times the minimum size of the width of the wiring grooves 108, because the water degassing efficiency can be enhanced.

Also, the relatively greater the number of wiring grooves 108 and the number of dummy wiring grooves 111, the better. This is because the amount of water degassing can be increased by increasing the number of wiring grooves 108 and the number of dummy wiring grooves 111.

Furthermore, the degassing efficiency can be increased by making the ratio of the sum total of the opening areas of all of the wiring grooves 108 and the dummy wiring groove 111 to the total area (of the substrate) including the area other than the openings be 0.1% to 80%. This ratio is determined by the numbers that allow proper formation of the wiring grooves and the dummy wiring grooves and by the sizes of the openings.

Also, in addition to the process step of performing the heat treatment after the formation of the wiring grooves 108 and the dummy wiring groove 111, a heat treatment may be performed after the formation of the contact holes and before the formation of the contacts 103. Moreover, in addition to the process step of performing the heat treatment after the formation of the wiring grooves and the dummy wiring groove, a heat treatment may be performed after the formation of the contacts 103. The effects produced by these heat treatments are the same as those described in the first embodiment.

Also, in the method of this embodiment, in the process step shown in FIG. 6D, the heat treatment is performed after the formation of the wiring grooves 108 and the dummy wiring groove 111. However, instead of this process step or in addition to this process step, a heat treatment may be performed after the wiring grooves 108 and the dummy wiring groove 111 are filled with a barrier metal film made of an oxidizing metal, such as molybdenum, and with a metal film made of copper or the like. This process step produces the following effects.

As can be seen from FIG. 5, molybdenum whose oxide-formation energy is low easily reacts with water ($H_2O$) to form an oxide. Thus, if a heat treatment is performed after the interconnects and the dummy interconnect are formed using an oxidizing metal, such as molybdenum, or a nitride thereof as a barrier metal film, water from the insulating film having relatively high moisture absorbency preferentially reacts with the barrier metal film, thereby producing the effect of suppressing degradation of the other insulating films. In the example described above, molybdenum and a molybdenum nitride are used as the barrier metal film. However, even if chromium, cobalt, platinum, and tungsten, which are also oxidizing metals, and nitrides thereof are used as the barrier metal film, the same effect obtained when molybdenum is used can be achieved. Moreover, by performing a heat treatment not only after the formation of the barrier metal film made of an oxidizing metal, such as molybdenum, in the wiring grooves 108 and in the dummy wiring groove 111, but also after filling the contact holes by using an oxidizing metal, such as molybdenum, as a barrier metal film, the barrier metal film made of an oxidizing metal preferentially reacts with water, thereby further suppressing degradation of the second insulating film 102 and of the other insulating films.

Moreover, in the method of this embodiment, a silicon oxide film having relatively high moisture absorbency is used as the second insulating film 102, however, a material that has such an excellent filling characteristic as being able to fill a gap between narrow-pitch gates without causing voids, such as an $O_3$-TEOS (Tetraetylorthosilicate) film or an SOD (Spin on Dielectric) film, or a low dielectric-constant insulating film material, such as an OSG (organo-silicate glass) film, a methyl-silsesquioxane (MSQ) film, or a carbon-containing silicon oxide (SiOCH) film, may be used instead.

Furthermore, the shape of the opening of the dummy wiring groove may be square, rectangular, or circular.

Also, in the process step shown in FIG. 6A, dummy contact holes may be formed, and dummy contacts may be formed by the same method used in the first embodiment. In this case, it is possible to further increase the amount of water removed from the second insulating film 102 by performing a heat treatment after the formation of the dummy contact holes or after the formation of the dummy contacts, thereby enabling the reliability of the semiconductor device to be increased.

As described above, the methods according to the invention are effective in increasing the reliability of semiconductor devices including multilevel interconnections.

What is claimed is:

1. A method for fabricating a semiconductor device, comprising the steps of:
    (a) forming a first insulating film having moisture absorbency on a substrate;
    (b) forming a dummy contact hole and a contact hole in the first insulating film, the contact hole going fully through the first insulating film;

(c) heat-treating the substrate, thereby removing water contained in the first insulating film;

(d) filling the contact hole and the dummy contact hole with a conductive material, thereby forming a contact and a dummy contact, (e) after the step (d), forming, on the first insulating film, a second insulating film, in which a wiring groove is formed on the first insulating film and the contact; and (f) filling the wiring groove with a conductive material, thereby forming an interconnect on the contact, wherein in the step (b), the dummy contact hole and the contact hole are formed by the same step.

2. The method of claim 1, wherein the step (c) is performed at least after the step (b) and before the step (d).

3. The method of claim 1, wherein the step (c) is performed at least after the step (d).

4. The method of claim 3, wherein the contact and the dummy contact include a first barrier metal film and a first metal film, the first barrier metal film being formed along inner faces of the contact hole and of the dummy contact hole and being made of an oxidizing metal, the first metal film being formed on the first barrier metal film to fill the contact hole and the dummy contact hole.

5. The method of claim 4, wherein the first barrier metal film is made of at least one element selected from the group consisting of molybdenum, chromium, cobalt, platinum, and tungsten.

6. The method of claim 1, wherein the step (c) is also performed after the step (e) and before the step (f).

7. The method of claim 6, wherein a dummy wiring groove is also formed in the second insulating film; and in the step (f), the dummy wiring groove is filled with a conductive material, thereby forming a dummy interconnect.

8. The method of claim 7, wherein the interconnect and the dummy interconnect include a second barrier metal film and a second metal film, the second barrier metal film being formed along inner faces of the wiring groove and of the dummy wiring groove and being made of an oxidizing metal, the second metal film being formed on the second barrier metal film to fill the wiring groove and the dummy wiring groove; and the step (c) is also performed after the step (e).

9. The method of claim 8, wherein the second barrier metal film is made of at least one element selected from the group consisting of molybdenum, chromium, cobalt, platinum, and tungsten.

10. The method of claim 1, wherein the heat treatment in the step (c) is performed in an atmosphere in which at least one element selected from the group consisting of nitride, oxygen, hydrogen, and rare gas is contained.

11. The method of claim 1, wherein the heat treatment in the step (c) is performed at a temperature of 200° C. to 800° C.

12. The method of claim 1, wherein the diameter of an opening of the dummy contact hole is 0.5 to 10 times a minimum size of the diameter of an opening of the contact hole.

13. The method of claim 1, wherein a ratio of a sum total of areas of openings of all of the contact hole and the dummy contact hole to an entire area of the substrate is 0.1% to 50%.

14. The method of claim 1, wherein an opening of the dummy contact hole is square, rectangular, or circular in shape.

15. The method of claim 1, wherein the dummy contact hole does not go fully through the first insulating film.

16. A method for fabricating a semiconductor device, comprising the steps of:

(a) forming, on a substrate, a first insulating film in which a contact hole is formed and which has moisture absorbency;

(b) filling the contact hole with a conductive material, thereby forming a contact going fully through the first insulating film;

c) forming, on the first insulating film, a second insulating film, in which a wiring groove is formed on the contact and a dummy wiring groove is formed on the first insulating film;

(d) after the step (c), heat-treating the substrate, thereby removing water contained in the first insulating film; and (e) filling the wiring groove and the dummy wiring groove with a conductive material, thereby forming an interconnect and a dummy interconnect, wherein in the step (c), the dummy wiring groove and the wiring groove are formed by the same step.

17. The method of claim 16, wherein the step (d) is performed at least before the step (e).

18. The method of claim 16, wherein the interconnect and the dummy interconnect include a barrier metal film and a metal film, the barrier metal film being formed along inner faces of the wiring groove and of the dummy wiring groove and being made of an oxidizing metal, the metal film being formed on the barrier metal film to fill the wiring groove and the dummy wiring groove; and the step (d) is performed at least after the step (e).

19. The method of claim 18, wherein the barrier metal film is made of at least one element selected from the group consisting of molybdenum, chromium, cobalt, platinum, and tungsten.

20. The method of claim 16, wherein the heat treatment in the step (d) is performed in an atmosphere in which at least one element selected from the group consisting of nitride, oxygen, hydrogen, and rare gas is contained.

21. The method of claim 16, wherein the heat treatment in the step (d) is performed at a temperature of 200° C. to 800° C.

22. The method of claim 16, wherein an opening of the dummy wiring groove is square, rectangular, or circular in shape.

23. The method of claim 16, wherein the width of the dummy wiring groove is 0.5 to 100 times a minimum size of the width of the wiring groove.

24. The method of claim 16, wherein a ratio of a sum total of areas of openings of all of the wiring groove and the dummy wiring groove to an entire area of the substrate is 0.1% to 80%.

25. The method of claim 1, wherein the dummy contact is incapable of having current flow therethrough.

26. The method of claim 16, wherein the dummy contact is incapable of having current flow therethrough.

27. The method of claim 1, wherein the first insulating film has higher moisture absorbency than the second insulating film.

28. The method of claim 1, wherein the dummy contact hole formed in the step (a) is formed to the vicinity of a lower surface of the first insulating film.

29. The method of claim 1, wherein the dummy contact hole formed in the step (a) is formed so as to pass through the first insulating film.

30. The method of claim 1, wherein after the step (f), an upper surface of the dummy contact has the same height as that of the contact.

31. A method for fabricating a semiconductor device, comprising the steps of:
- (a) forming a first insulating film having moisture absorbency on a substrate;
- (b) forming a dummy contact hole and a contact hole in the first insulating film, the contact hole going fully through the first insulating film;
- (c) heat-treating the substrate, thereby removing water contained in the first insulating film; and
- (d) filling the contact hole and the dummy contact hole with a conductive material, thereby forming a contact and a dummy contact, wherein the dummy contact hole formed in the step (a) is formed to the vicinity of a lower surface of the first insulating film.

32. The method of claim 31, wherein the dummy contact hole formed in the step (a) is formed so as to pass through the first insulating film.

* * * * *